United States Patent
Abramson et al.

(10) Patent No.: US 9,488,924 B2
(45) Date of Patent: Nov. 8, 2016

(54) CLEANING AN OBJECT WITHIN A NON-VACUUMED ENVIRONMENT

(71) Applicant: APPLIED MATERIALS ISRAEL, LTD., Rehovot (IL)

(72) Inventors: Mariano Abramson, Jerusalem (IL); Hadar Mazaki, Gan Yavne (IL); Erez Admoni, Petah Tikva (IL); Israel Avneri, Ramat-Gan (IL)

(73) Assignee: Applied Materials Israel Ltd., Rehovot (IL)

(*) Notice: Subject to any disclaimer, the term of this patent is extended or adjusted under 35 U.S.C. 154(b) by 290 days.

(21) Appl. No.: 14/149,677

(22) Filed: Jan. 7, 2014

(65) Prior Publication Data

US 2015/0192868 A1    Jul. 9, 2015

(51) Int. Cl.
  *G03B 27/42* (2006.01)
  *G03F 7/20* (2006.01)
  *H01L 21/67* (2006.01)
  *H01L 21/677* (2006.01)

(52) U.S. Cl.
  CPC ..... *G03F 7/70916* (2013.01); *H01L 21/67028* (2013.01); *H01L 21/6776* (2013.01)

(58) Field of Classification Search
  CPC .............. H01L 21/67051; H01L 21/02057; H01L 21/67017; G03F 7/70916; G03F 7/70341; G03F 7/70925; G03F 7/70933; C23C 16/455; C23C 16/45519; B08B 5/02; B08B 3/024; B08B 5/04
  See application file for complete search history.

(56) References Cited

U.S. PATENT DOCUMENTS

| | | | |
|---|---|---|---|
| 7,522,258 B2 | 4/2009 | Luttikhuis et al. | |
| 2002/0145711 A1* | 10/2002 | Magome | G03F 7/70858 355/30 |
| 2003/0169407 A1 | 9/2003 | Hasegawa et al. | |
| 2004/0218158 A1* | 11/2004 | Nishi | G03F 7/70808 355/30 |
| 2007/0002297 A1* | 1/2007 | Luttikhuis | G03F 7/7075 355/55 |
| 2007/0139629 A1* | 6/2007 | Sengers | G03F 7/7075 355/53 |

* cited by examiner

*Primary Examiner* — Mesfin Asfaw
(74) *Attorney, Agent, or Firm* — Kilpatrick Townsend & Stockton LLP

(57) ABSTRACT

A system that may include a mechanical stage that is arranged to move an object along a predetermined path in relation to an optical module during an illumination of the object by the optical module; a structural support element that is arranged to support at least a part of the optical module; a gas flow module that is arranged to direct clean gas towards the object through gas flow module openings that define a coverage area that is (a) bigger than the object and (b) is positioned directly above at least a majority of the object when the object is positioned anywhere along the predetermined path.

24 Claims, 14 Drawing Sheets

Directing, by a gas flow module, clean gas towards the object. The first opening is defined by a structural support element that is arranged to support a first optical element that is positioned above the structural support element. The gas flow module is positioned below the structural support element and is shaped to define the second opening. The object is positioned in a non-vacuumed environment. 220

Directing nanometric electromagnetic radiation, by a second optical element, towards an object and through first and second openings. 210

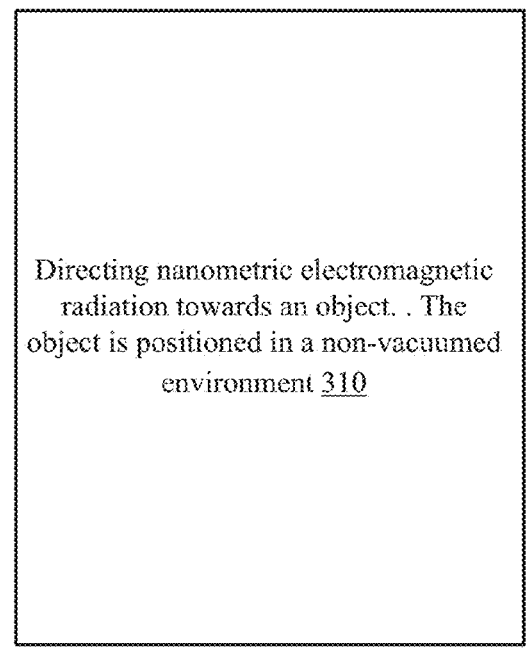
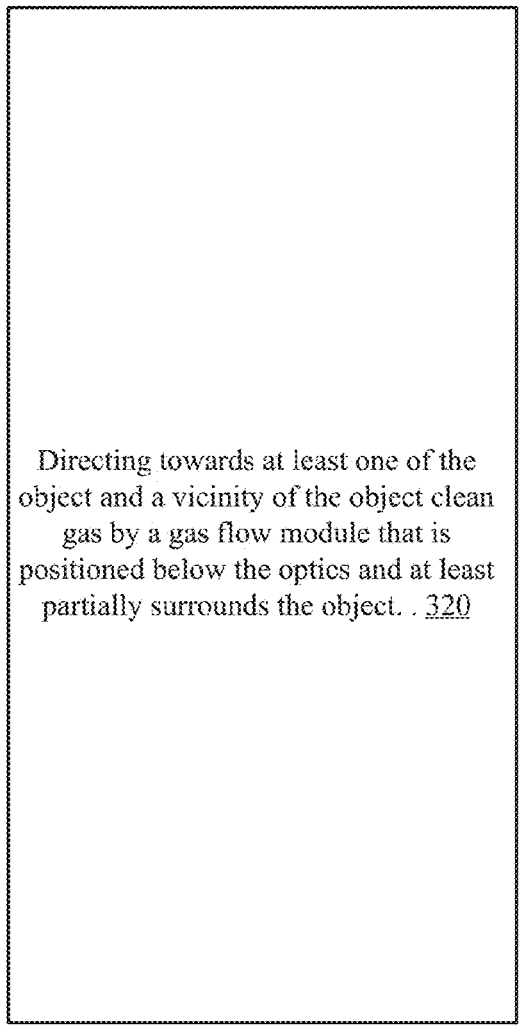
FIG. 14

CLEANING AN OBJECT WITHIN A NON-VACUUMED ENVIRONMENT

BACKGROUND

The inspection tools in Semiconductors Industry help the manufactures to find and alert about defects or particle contamination in the wafers. Since the tests are nondestructive, the inspection tool should not add any kind of contamination, specifically particle contamination on the wafer.

The environment requirement of the wafer is harder to achieve due the continuous shrinking of the design rule of the wafers. This is specified by ISO 14644-1 cleanroom standards:

| | Maximum particle per square meter | | | | | FED |
|---|---|---|---|---|---|---|
| Class | ≥0.1 micron | ≥0.2 micron | ≥0.3 micron | ≥0.5 micron | ≥1 micron | STD 209E equivalent |
| ISO1 | 10 | 2 | | | | |
| ISO2 | 100 | 24 | 10 | 4 | | |
| ISO3 | 1000 | 237 | 102 | 35 | 8 | Class 1 |
| ISO4 | 10000 | 2370 | 1020 | 352 | 83 | Class 10 |

For modern tools the requirement is ISO class1.

It is important to note the real requirement of wafer manufacturers. What they really want is to have no particles on the wafer. This is measured by PWP (particles per wafer path) indicated by number of particles added to the wafer during the pass of the wafer in the tool. For example 0.25 PWP which means less than 1 particle is added for each 4 wafer passes.

The typical design to control the cleanliness of the tool is using a controlled minienvironment. The minienvironment consist of box containing the critical parts of the tools where a constant laminar gas flow of 0.35 m/s is forced to go vertically downwards. The gas is previously filtered by a high performance ULPA filter. In this way the wafer is exposed to particle free gas. The problem with this concept is that the flow to the wafer is normally obstructed by an optical bench which is a massive construction. In addition the wafer is normally placed on an X-Y stage which can produce particles by itself when performing the scanning U.S. Pat. No. 7,522,258 describes a lithographic apparatus and device manufacturing method utilizing movement of clean air to reduce contamination.

SUMMARY

According to an embodiment of the invention, there is provided a system that may include a mechanical stage that is arranged to move an object along a predetermined path in relation to an optical module during an illumination of the object by the optical module; a structural support element that is arranged to support at least a part of the optical module; a gas flow module that is arranged to direct clean gas towards the object through one or more gas flow module openings that define a coverage area that is (a) bigger than the object and (b) is positioned directly above at least a majority of the object when the object is positioned anywhere along the predetermined path.

The coverage area may be positioned directly above at least fifty, sixty, seventy, eighty or ninety percent of the object when the object is positioned anywhere along the predetermined path. The gas flow module may comprise at least one gas inlet for receiving either gas or clean gas.

According to an embodiment of the invention, the system further comprises a gas inlet for receiving gas; a gas conduit that extends between the gas inlet and the gas flow module; a pump for directing the gas from the gas inlet and through the conduit towards the gas flow module; a filter for filtering the gas to provide the clean gas; wherein the filter is positioned within the conduit or within the gas flow module; and wherein the pump is spaced apart from the gas flow module. The gas inlet may be positioned above an optical element of the optical module. The distance between the pump and the gas flow module may be smaller than a distance between the gas inlet and the pump.

According to an embodiment of the invention there is provided a system, comprising: optics arranged to direct electromagnetic radiation of nanometric wavelength towards an object; a gas flow module that is positioned below the optics and below the object, and at least partially surrounds the object, and is arranged to direct clean gas towards at least one out of the object and a vicinity of the object.

According to an embodiment of the invention there is provided a method for directing clean gas towards an object, the method comprising: moving an object by a mechanical stage and along a predetermined path in relation to an optical module during an illumination of the object by the optical module; while supporting the at least a part of the optical module by a structural support element, directing by a gas flow module direct clean gas towards the object through one or more gas flow module openings that define a coverage area that is (a) bigger than the object and (b) is positioned directly above at least a majority of the object when the object is positioned anywhere along the predetermined path.

According to an embodiment of the invention, the gas flow module is arranged to direct gas flows towards contaminating elements positioned at a vicinity of the object and thereby reject contaminates from reaching the object. According to another embodiment of the invention, the mechanical stage is arranged to move the object at a fixed velocity in the range of 0.1-2 meters per second. According to yet another embodiment of the invention, the gas flow module is arranged to direct the clean gas in a velocity in the range of 0.1-0.5 meters per second. According to an embodiment of the invention, a distance between the optical module and the object is in the range of 10-50 millimeters.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof may best be understood by reference to the following detailed description when read with the accompanying drawings in which:

FIG. 11 illustrates a method, according to an embodiment of the invention;

FIG. 14 illustrates a method, according to an embodiment of the invention.

Figure 1:
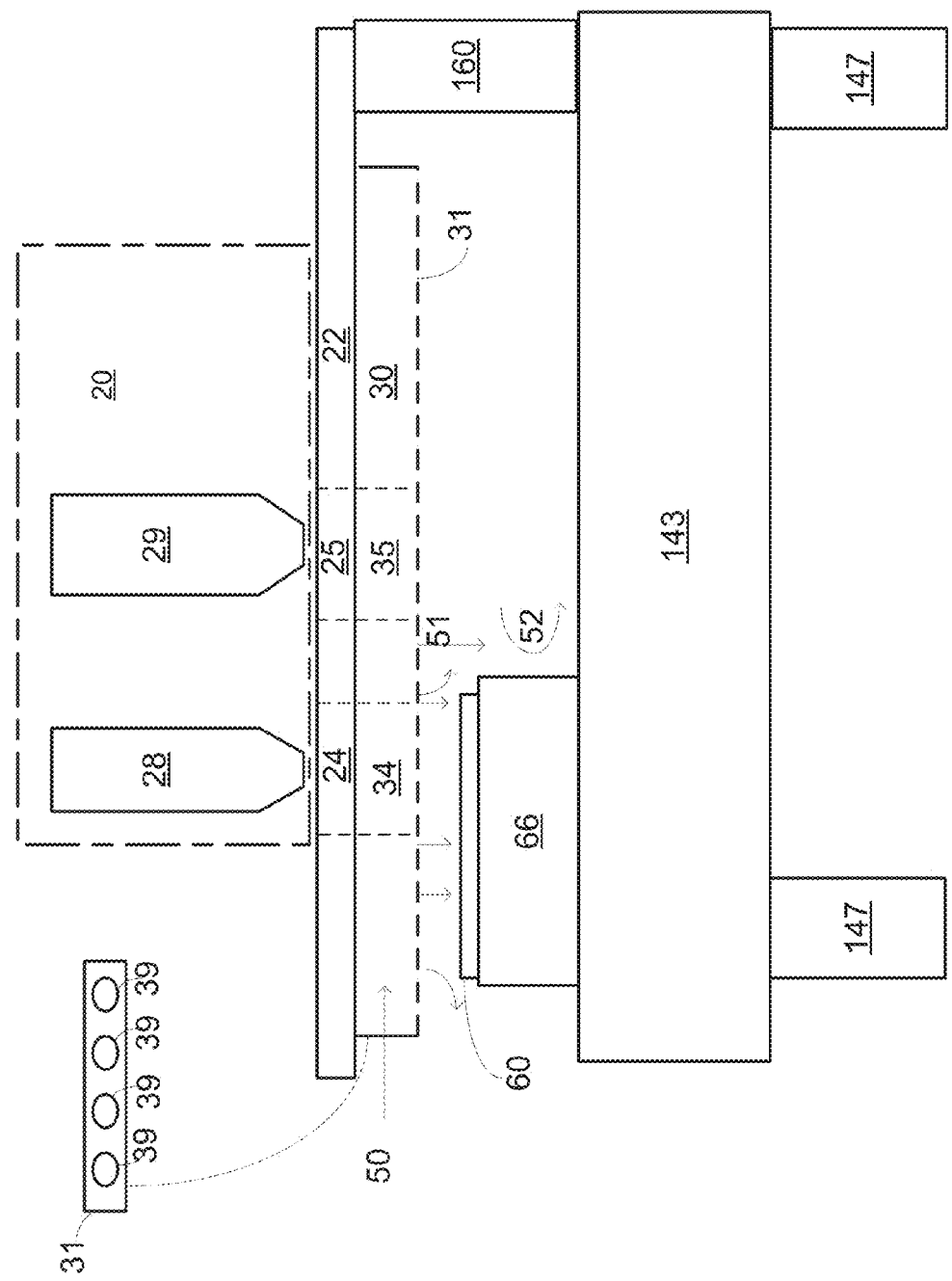
FIG. 1 illustrates a system according to an embodiment of the invention.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE DRAWINGS

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Because the illustrated embodiments of the present invention may, for the most part, be implemented using electronic components and modules known to those skilled in the art, details will not be explained in any greater extent than that considered necessary as illustrated above, for the understanding and appreciation of the underlying concepts of the present invention and in order not to obfuscate or distract from the teachings of the present invention.

The assignment of the same reference numbers to various components may indicate that these components are similar to each other.

The terms air and gas are used in an interchangeable manner.

According to various embodiments of the invention there is provided a system. The system may be an optical system for evaluation, such as an inspection system, a metrology system, a defect review system, as well as a lithographic system and the like.

The system is arranged to receive an object such as a wafer, a solar panel, a MEMS device or any other object that has microscopic and even nanometric scale features and is arranged to direct electromagnetic radiation towards the object during a process that may be an evaluation process such as an inspection process, a metrology process, or a defect review process, or a manufacturing process such as a lithography process. The electromagnetic radiation can be in the visible light range, can have nanometric scale wavelength, and the like —for example 193 nanometers and below. For simplicity of explanation some of the figures illustrate an object that is a wafer but the object may differ from wafer.

Figure 6:
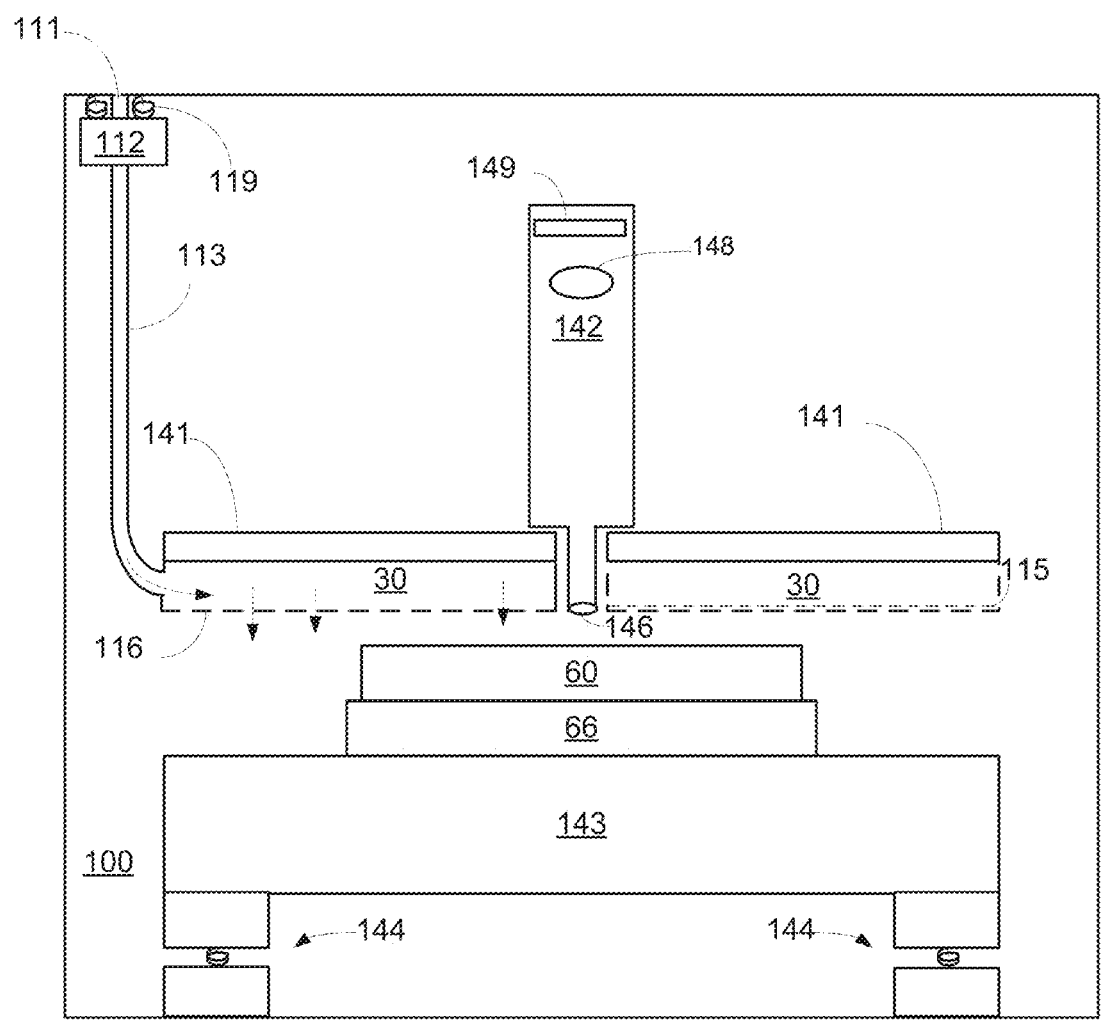
FIG. 6 illustrates a system according to an embodiment of the invention.
Figure 7:
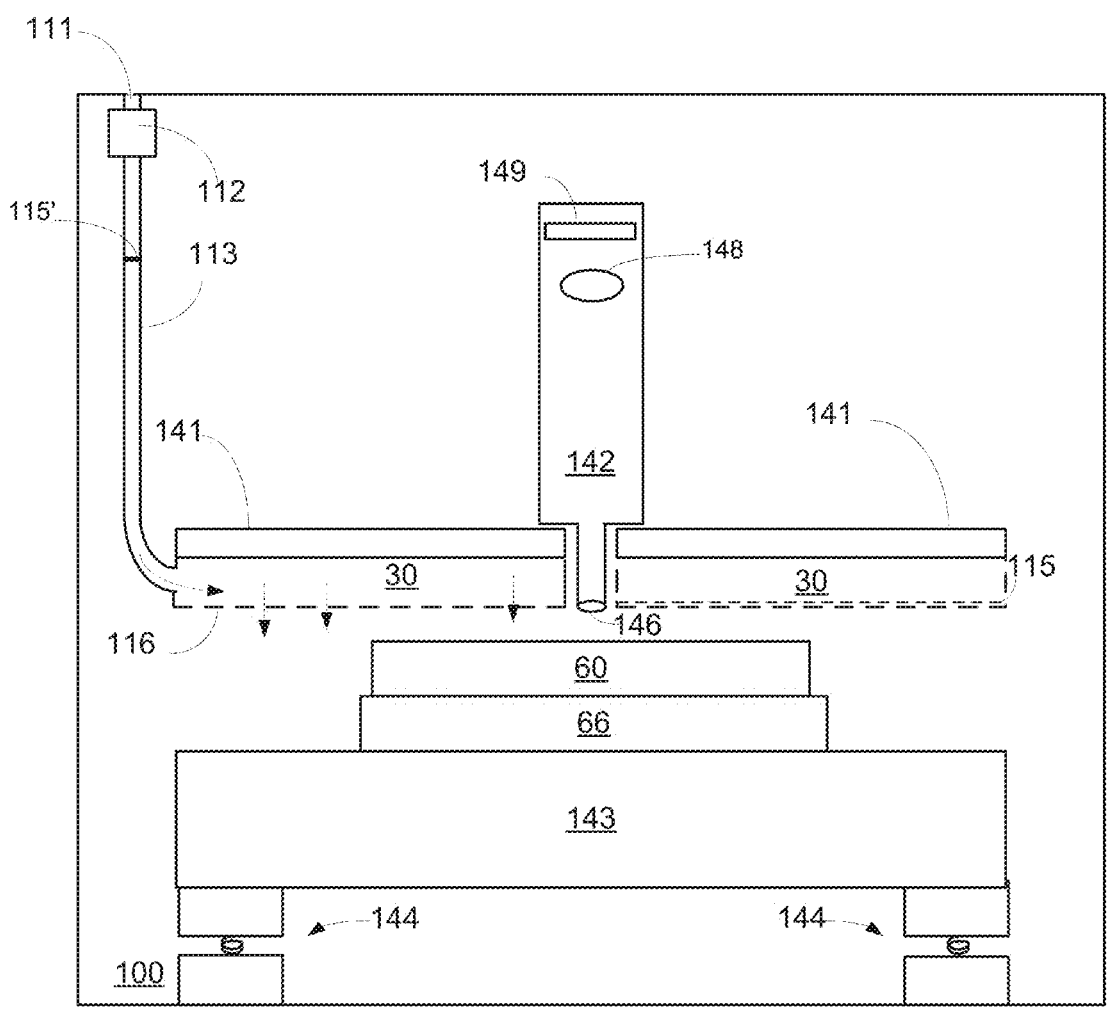
FIG. 7 illustrates a system according to an embodiment of the invention.
Figure 8:
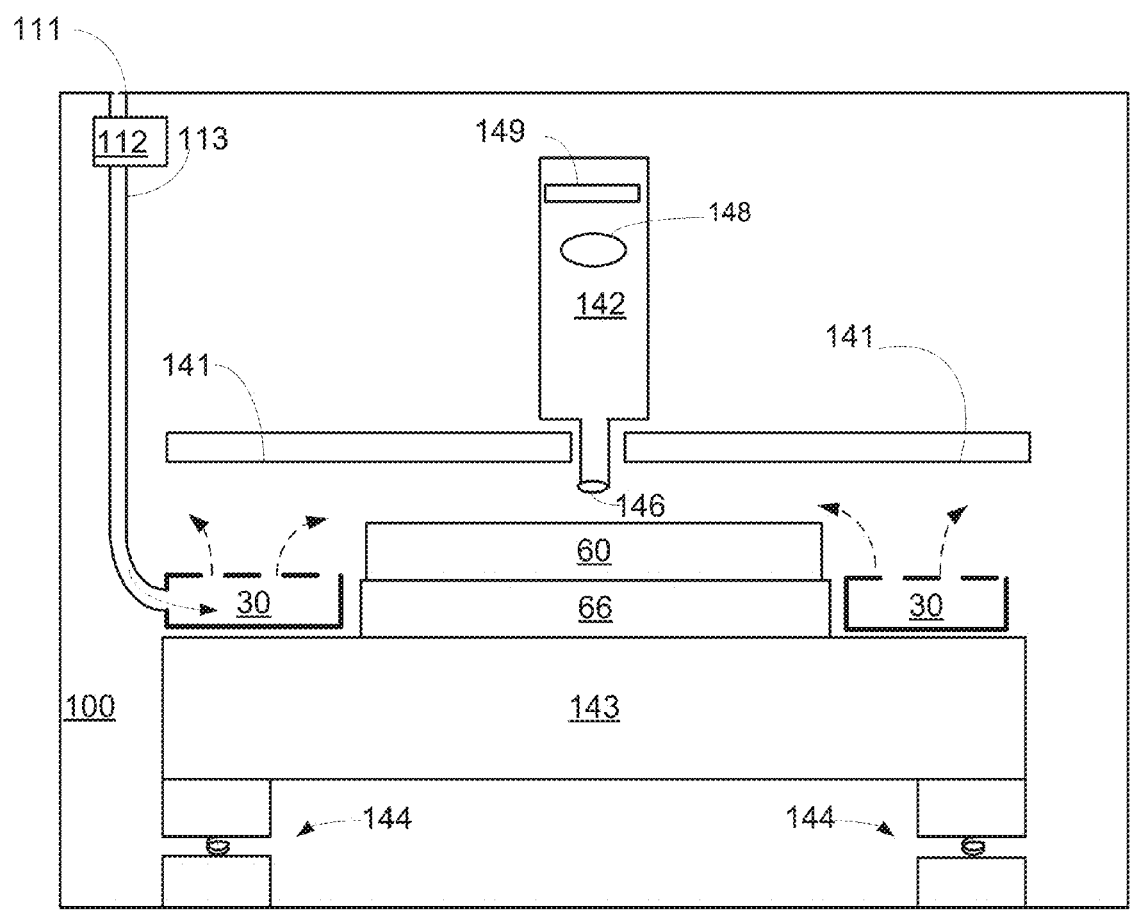
FIG. 8 illustrates a system according to an embodiment of the invention.
Figure 9:
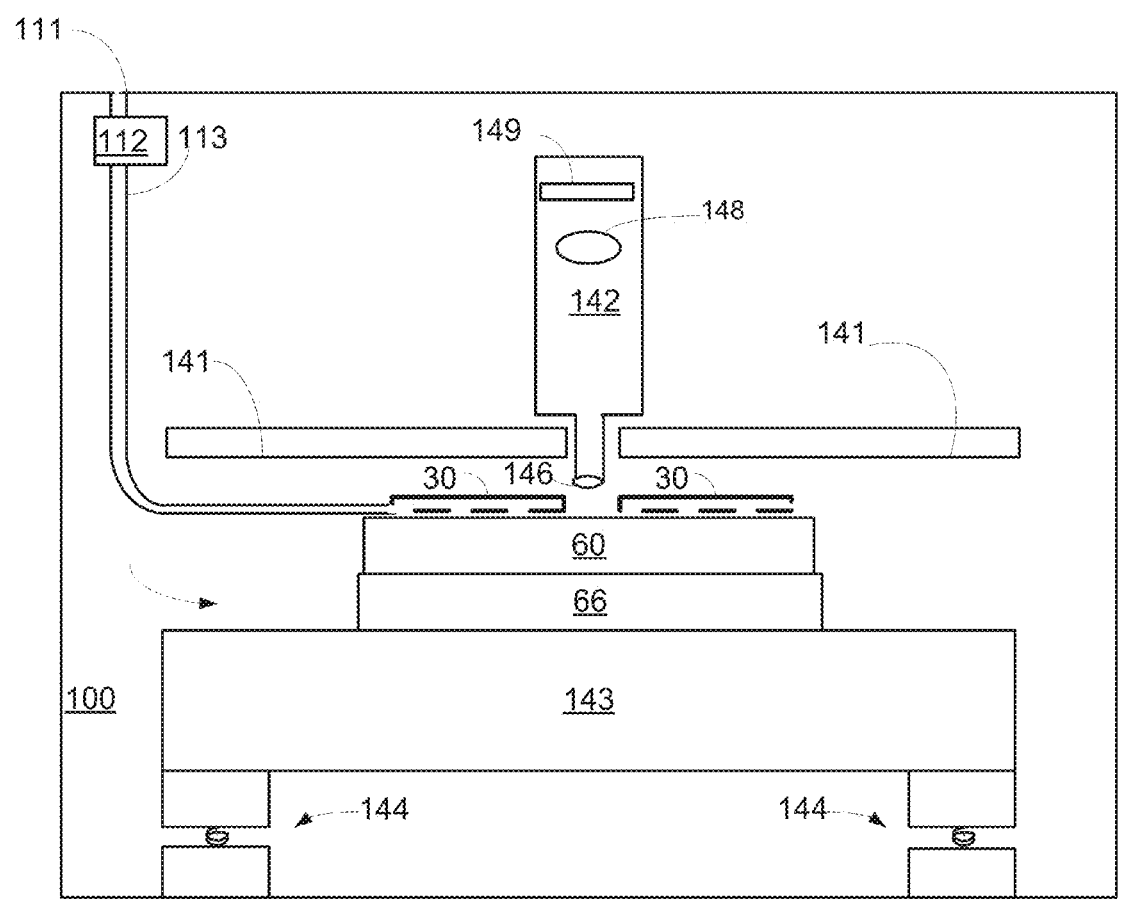
FIG. 9 illustrates a system according to an embodiment of the invention.

The system includes optics. The optics is arranged to manipulate, direct, shape or otherwise affect the nanometric electromagnetic radiation that illuminates the object. It may, for example, shape, deflect, split, collimate, converge one or more beams of nanometric electromagnetic radiation. The optics can be arranged in various forms. FIGS. 6-8 illustrate optics 142 that include a light source 149, first lens 148 and another lens 146. The optics can be included in an evaluation head that may also include sensors/detectors.

The optics may include multiple optical elements and may be arranged in a so-called optical bench. An optical element is any element capable of affecting the nanometric radiation. An optical element may be or may include a lens (such as an objective lens, a deflecting lens, a collimating lens, and focusing lens and the like), a column, an aperture, a beam splitter, a collimator, a scattering array, a microscope, a portion of a microscope and the like.

The object can be scanned or otherwise illuminated (for example—using area illumination) with the electromagnetic radiation. The scanning may involve mechanical movement, non-mechanical deflection or a combination thereof. Typically, the object is positioned on a mechanical stage which can move the object in relation to the optics.

The optics can be supported by multiple structural elements. It may be desired to maintain the optics static or at least tightly control any movement of the optics.

Figure 2:
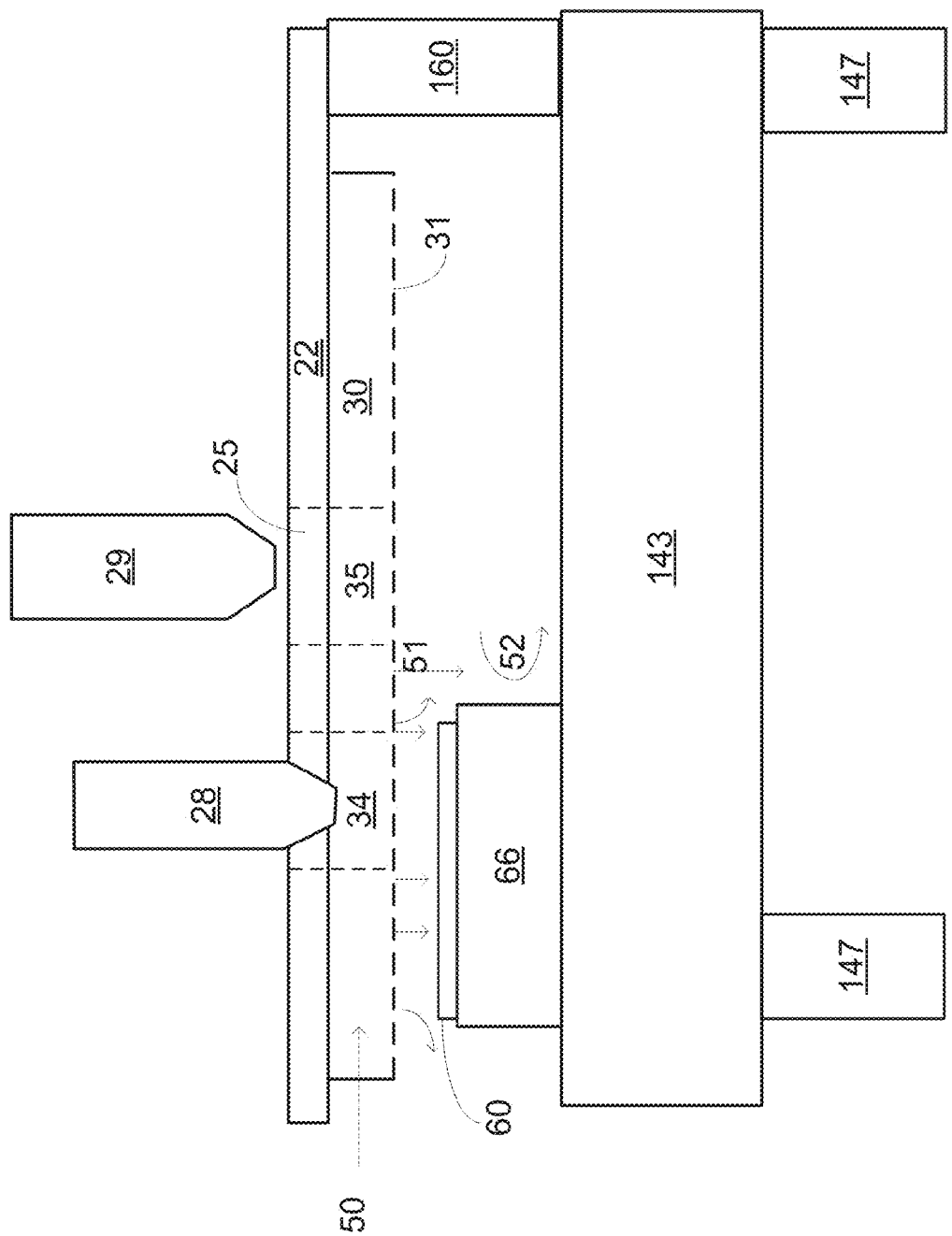
FIG. 2 illustrates a system according to an embodiment of the invention.
Figure 3:
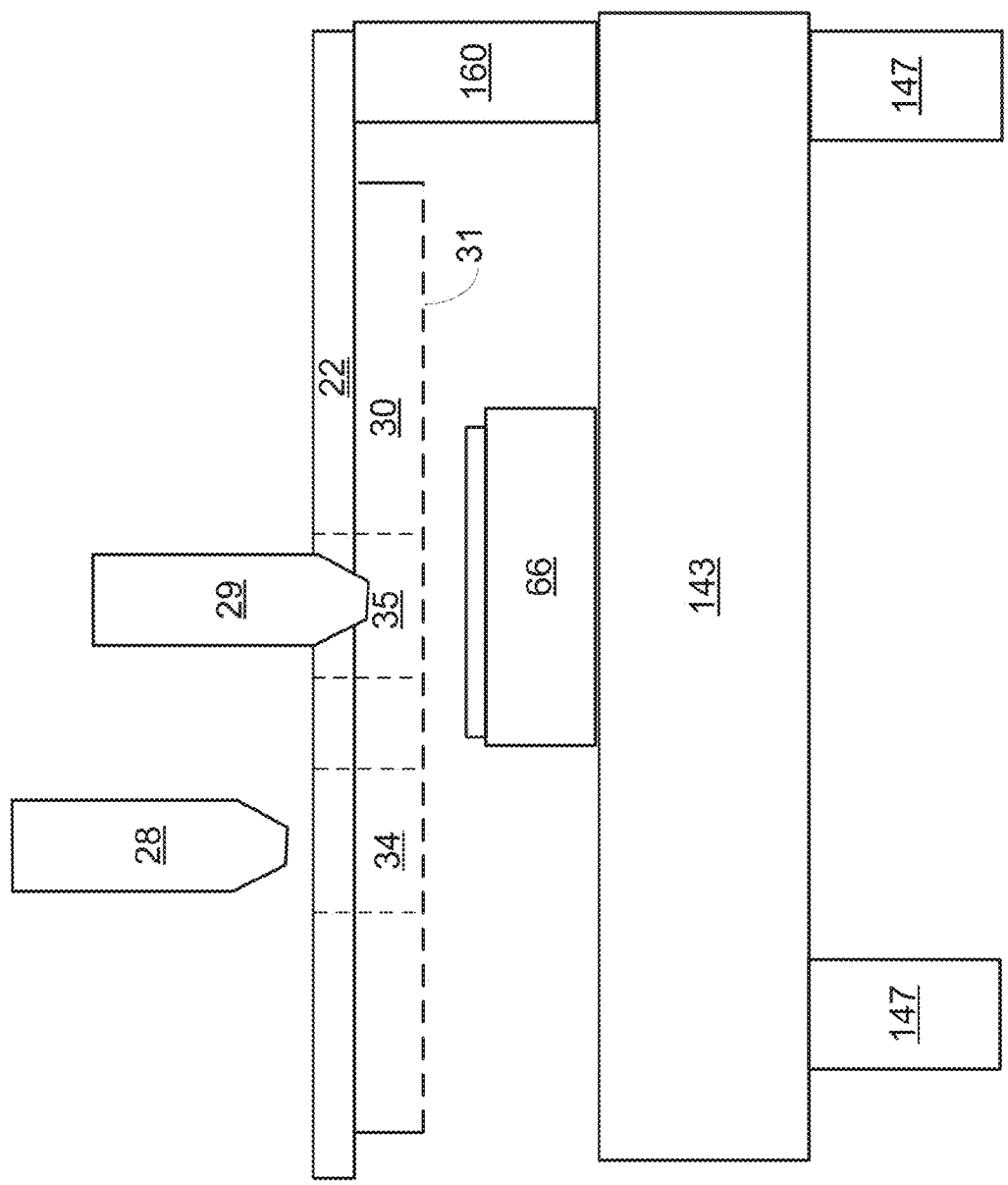
FIG. 3 illustrates a system according to an embodiment of the invention.
Figure 4:
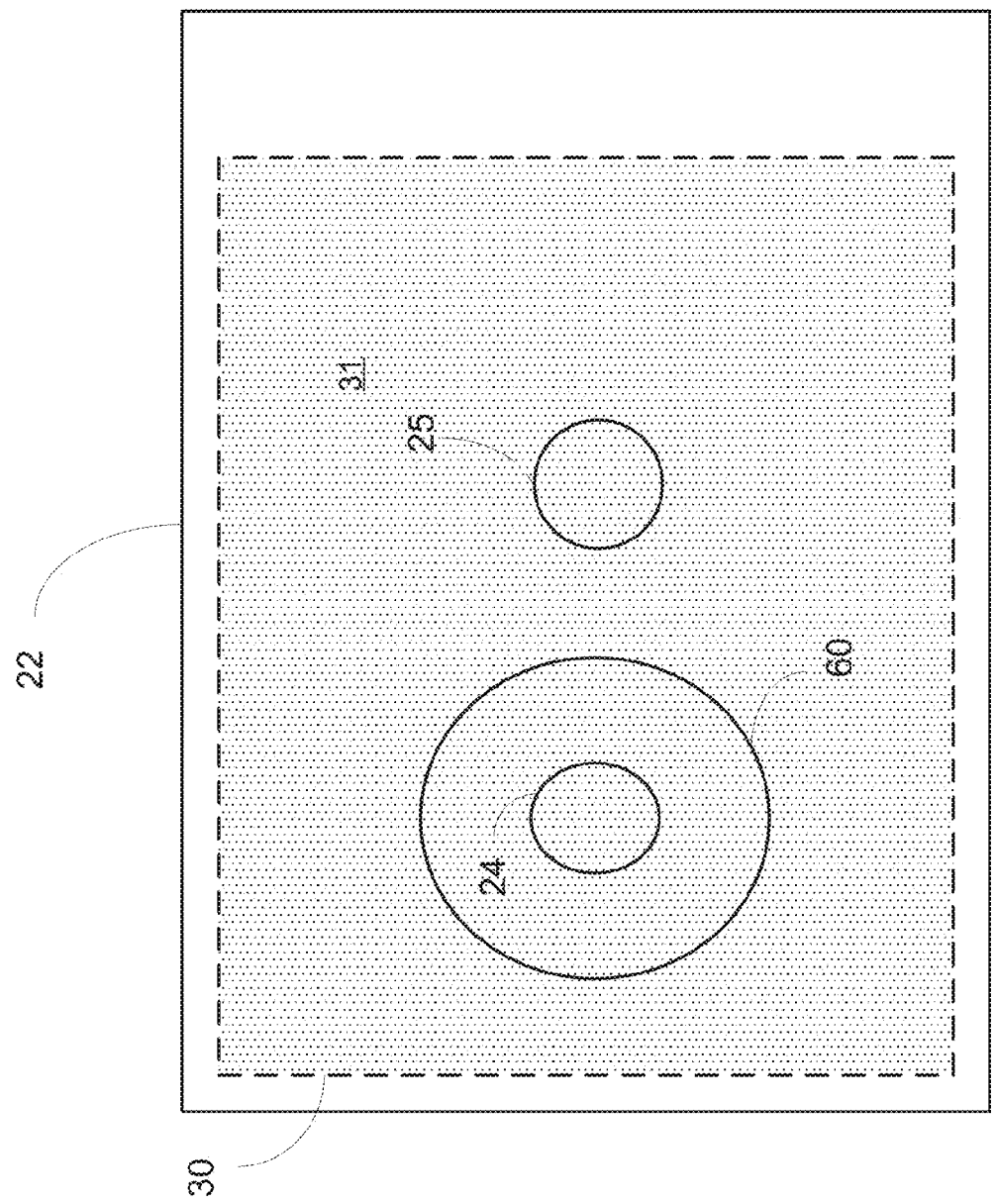
FIG. 4 is a top view of a lower plate, a gas flow module, a wafer and two lower plate apertures according to an embodiment of the invention.

The optics can include optical evaluation modules 28 and 29 of FIGS. 1-3. These optical evaluation modules may include optics, light sources, sensors and processors. The invention is not limited by the type of the optical module and can be implemented with e.g. continuous or pulsed illumination source; spot, line or aerial illumination; by a single beam or a plurality of beams, and more. While the invention is described herein with respect to an optical evaluation module (e.g., optical inspection, review and metrology), the invention can be implemented for a variety of processes, e.g. lithography.

The system may include a structural support element such as lower plate 22 of an optical bench (denoted 20 in FIG. 1) or support element 141 of optics 142 (of FIGS. 6-8).

Referring to FIGS. 1-3—lower plate 22 is shaped to define a first lower plate aperture (denoted 24 in FIG. 1-3) and second lower plate aperture (denoted 25 in FIGS. 1-3) and is arranged to support optical evaluation modules 26 and 29 that are located above lower plate 22 and light source 149 and lens 148 of FIGS. 6-8 that are positioned above the structural support element 141.

The system also includes a gas flow module (such as gas flow module 30 of FIGS. 1-3) that is positioned below the structural support element 22 and is arranged to direct clean gas towards an object. The gas flow module is shaped to define first and second main apertures 34 and 35. The radiation from the first and second evaluation modules 28 and 29 can pass through the first and second main apertures 34 and 35.

According to an embodiment of the invention, the object is positioned in a non-vacuumed environment.

In FIGS. 1-3 the gas flow module 30 includes a single main body that has multiple apertures (denoted 31 in FIGS. 4-5 and 10A-10C) formed at its bottom surface. It is noted that the gas flow module can include multiple spaced apart modules (now shown) that define the apertures.

In FIG. 2 the gas flow module 30 is positioned below the optical bench and above object 60. Object 60 is supported by and moved by stage 66 that in turn is supported by a granite table 143 that is positioned on support elements 148.

Clean gas can be provided from a unit positioned above the optical bench 20 and gas may exit through the bottom of the system 100. The optical bench 20 is supported by optical bench support elements 160 that are positioned on both sides of the stage 66.

A lower end of at least one of the first and evaluation modules 28 and 29 may be arranged to be positioned, at least during a certain point in time, within a space defined by the first and second lower plate apertures. This is illustrated in FIGS. 2 and 3.

The gas flow module may include multiple gas flow openings (illustrated by dashed lines 31 of FIGS. 1-3 and dots 31 of FIGS. 4-5 and 10A-10C) for directing the clean gas towards multiple locations. The gas flows may be vertical, non-vertical or a combination thereof. All the locations can belong to the object and/or a vicinity of the object. It may include a filter (such as filter 115). The gas flow from different apertures may be substantially equal (for example—allowed deviations may be less than 20%).

Figure 10C:
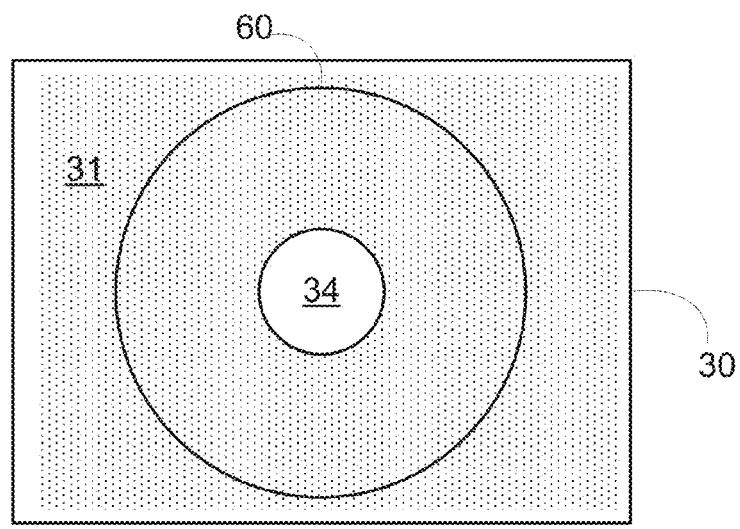
FIGS. 10A, 10B and 10C illustrates gas flow modules, objects and apertures, according to various embodiments of the invention.
Figure 10B:
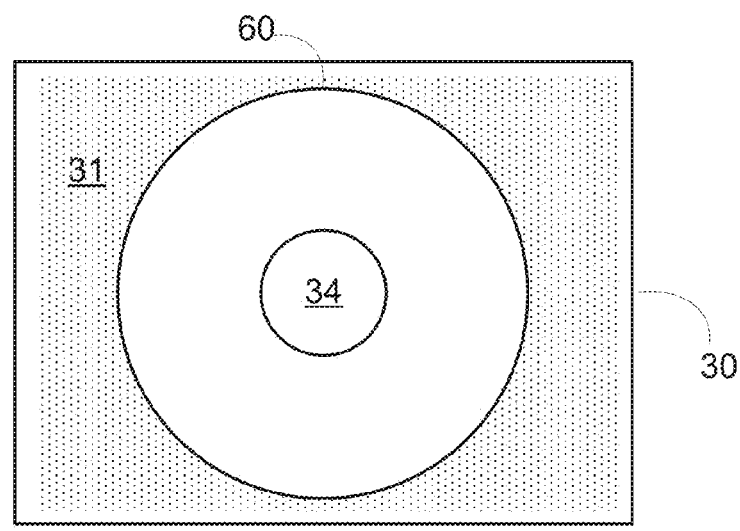
Figure 10A:
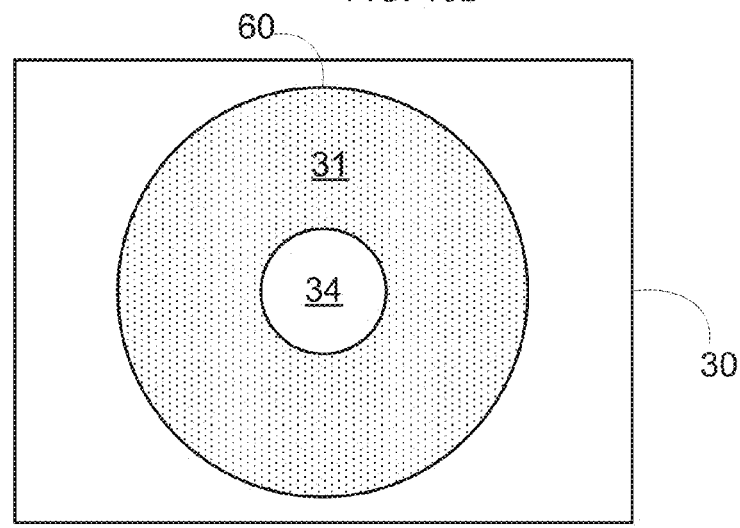

Some or all of the multiple gas flow openings are positioned directly above the object. Therefore—a projection of some or all of the multiple gas flow openings on a plane that is defined by an upper surface of the object "fall" on the upper surface of the object. FIG. 10A illustrates that all of the gas flow openings 38 are positioned directly above object 60.

Additionally or alternatively, at least some of the multiple gas flow openings surround the object and are not positioned directly above the object. Therefore—a projection of some or all of the multiple gas flow openings on a plane that is defined by an upper surface of the object "fall" outside the upper surface of the object. FIG. 10B illustrates that all of the gas flow openings 31 are not positioned directly above object 60.

Yet according to another embodiment of the invention some of the multiple gas flow openings surround the object and are not positioned directly above the object and at least some other gas flow openings are positioned directly above the object. FIG. 10C illustrates that some of the gas flow openings 38 are positioned directly above object 60 and some are not directly positioned above object 60.

The gas flow module may include at least one gas inlet for receiving either gas or clean gas. FIG. 1 illustrates vertical gas flows 50 that enter the gas flow module via openings 39 formed in a vertical sidewall 31 of the gas flow module 30. It is noted that the gas flow module can include one or more inlets for receiving the gas and that they may be spaced apart from each other, proximate to each other, located at a same height or at different heights and the like.

The gas flow module of FIGS. 3-9 is illustrates as having two horizontal bottom and top surfaces and vertical sidewalls. It is noted that it may have different shapes and sizes than those illustrated in FIGS. 3-9. The gas flow module may include one or more filters or may be preceded by one or more filters to provide clean gas. The gas flow module is a hardware component that receives gas or clean gas and outputs clean gas flows towards the object and/or the vicinity of the object. It may include zero or more filters.

FIGS. 6-8 illustrate the gas flow module as being fed with gas of clean gas supplied via a gas inlet 111 for receiving gas and a gas conduit 113. The gas conduit 113 extends between the gas inlet 111 and the gas flow module 30. A pump 112 is provided for directing the gas from the gas inlet 111 and through the conduit 113 towards the gas flow module 30. FIGS. 6 and 7 illustrate a filter 115 within the gas flow module. FIG. 7 also illustrates filter 115' within the gas conduit. The filter (115 of 115') is for filtering the gas to provide the clean gas. A filter may filter clean gas to provide an even cleaner gas.

According to an embodiment of the invention (and as illustrated in FIGS. 6-8) the pump is spaced apart from the gas flow module. This assists in reducing the effect of pump mechanical vibrations on the optics. Spaced apart may mean a distance that exceeds 50 cm, 1 meter and even more. The distance between the pump 112 and the gas flow module 30 may exceed (by a factor of K, wherein K may exceed two, three, four, five and even more) the distance between the gas inlet 111 and the pump 112.

The pump may be also connected to vibration dumping units (such as vibration dumping elements 119 of FIG. 6).

As illustrated in FIG. 1, the gas flow module may be arranged to direct gas flows towards contaminating elements positioned at a vicinity of the object and thereby reject contaminates from reaching the object.

In FIGS. 1-3 the gas flow module 30 is positioned below the optical bench and above object 60. Object 60 is supported by and moved by stage 66 that in turn is supported by a granite table 143 hat is positioned on support elements 148. Clean gas can be provided from a unit positioned above the optical bench 20 and gas may exit through the bottom of the system 100. The optical bench 20 is supported by optical bench support elements 160 that are positioned on both sides of the stage 66.

The gas flow module 30 may include one or more filters.

According to an embodiment of the invention a clean/filtered gas flow is provided immediately above the wafer and may cover all the range it can move. According to another embodiment of the invention, the clean/filtered gas flow is provided in a coverage area which covers at least cover a majority (for example—more than 50%, 60%, 70%, 80% and 90% of the area of object 60) of the wafer regardless a position of the object 60. Obviously there are some void areas that can't have gas flow as in the optics protruding and looking into the wafer but these void areas are relatively very small compared to the total area covered by the wafer movement limits.

Figure 5:
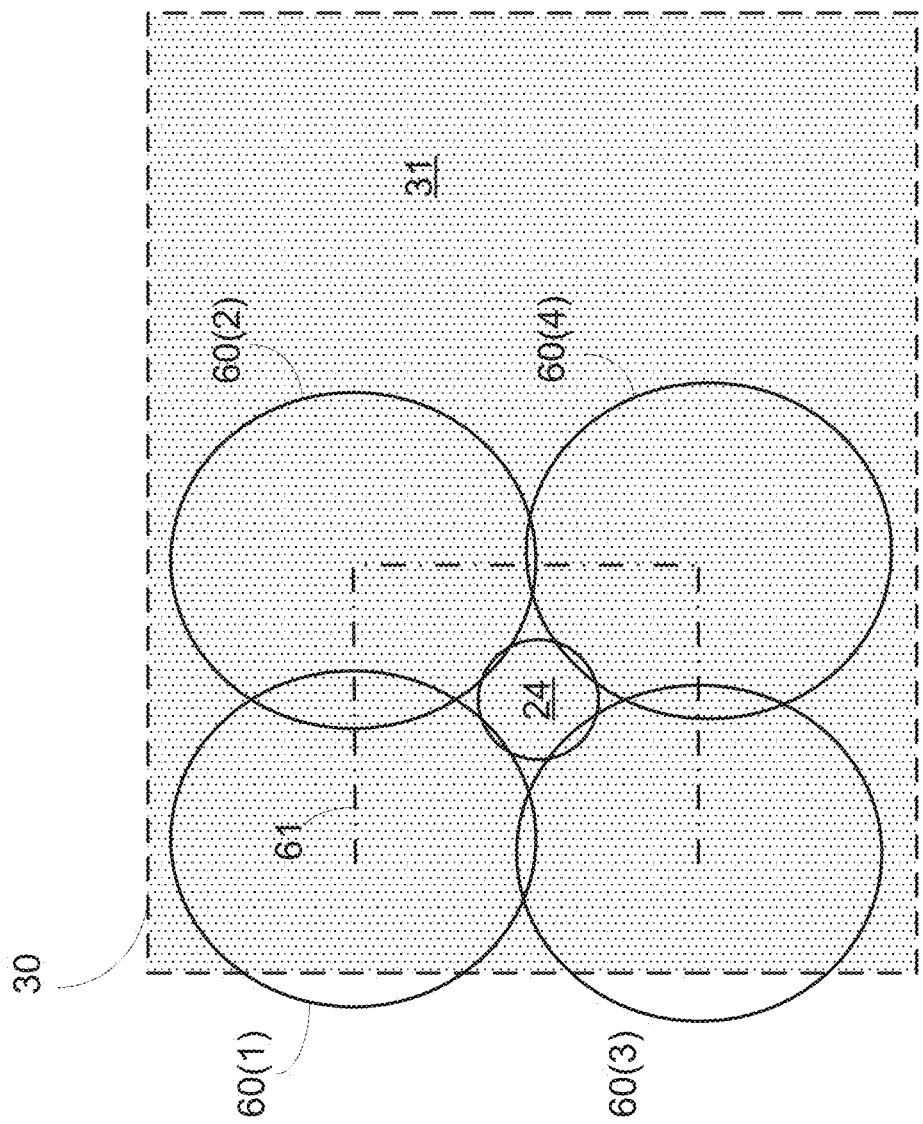
FIG. 5 is a top view of a lower plate, a gas flow module, a wafer that moves along a predetermined path and two lower plate apertures according to an embodiment of the invention.

Accordingly—if during the evaluation the object 60 is moved (by mechanical stage 66) along a pre-determined path (such as path 61 of FIG. 5) the openings 31 of the gas flow module are positioned directly above at least a majority of the object 60 in each location of the object 60 along the predefined path (see, for example positions 60(1)-60(4) of FIG. 5). This will cause the gas to flow along paths that have vertical as well as horizontal (or radial) elements that assist in directing contaminates towards the edges of the object 60 and then outside the object 60.

Another problem solved by this system is to keep contamination coming from the stage out of the wafer environment by constantly pushing them down thanks to the gas flowing downstream. This system may also release the complex design of non particle generating modules above the wafer since the volume where the wafer moves is controlled with treated gas which pushes away any potential particle coming from the higher modules.

Computer flow design (CFD) simulations have proven that there is no stream flowing to the wafer. Several situations has been studied as different wafer location as well the effect of the moving wafer. For example, for certain applications, the creation of a radial flow of air, coming from a direction normal to the surface, away from the center of the wafer is desired. The radial flow will be taking away from the wafer any particles that might be there e.g. as a consequence of stage movement. According to an embodiment of the invention, this radial flow is created by setting the distance between filter and wafer (e.g. 10-50 mm); stage movement (e.g. fixed movement of 0.1-2 meter per second, fixed), air velocity (0.1-0.5 meter per second). Analysis and experiments show that, for certain applications, under the above conditions, the coverage area can be smaller than the surface of the evaluated object (e.g. 50%, 60%, 70%, 80% or 90% of the surface of a 300 mm or 450 mm wafer), while providing sufficient cleanliness.

Figure 12:
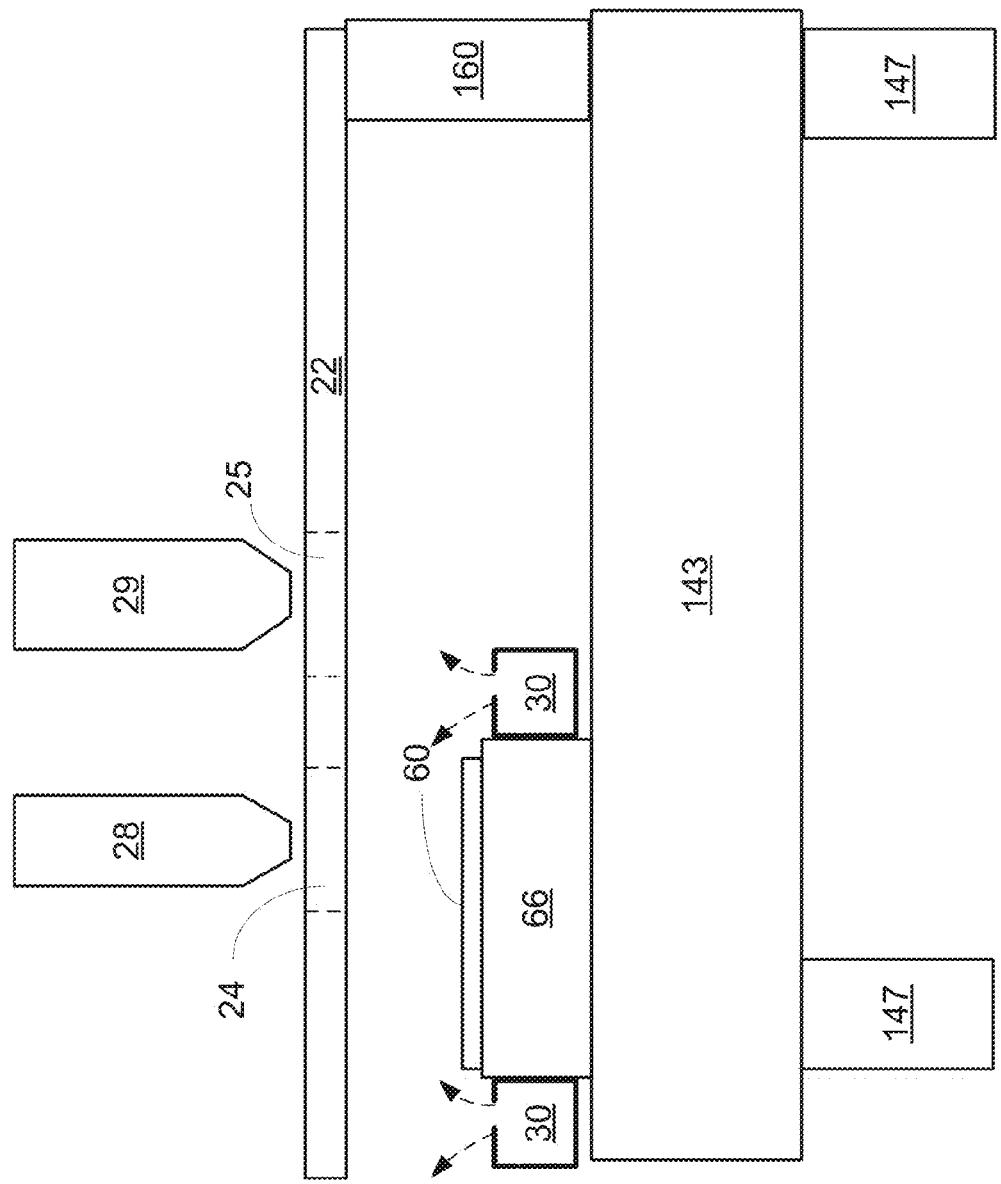
FIG. 12 illustrates a system according to an embodiment of the invention.
Figure 13:
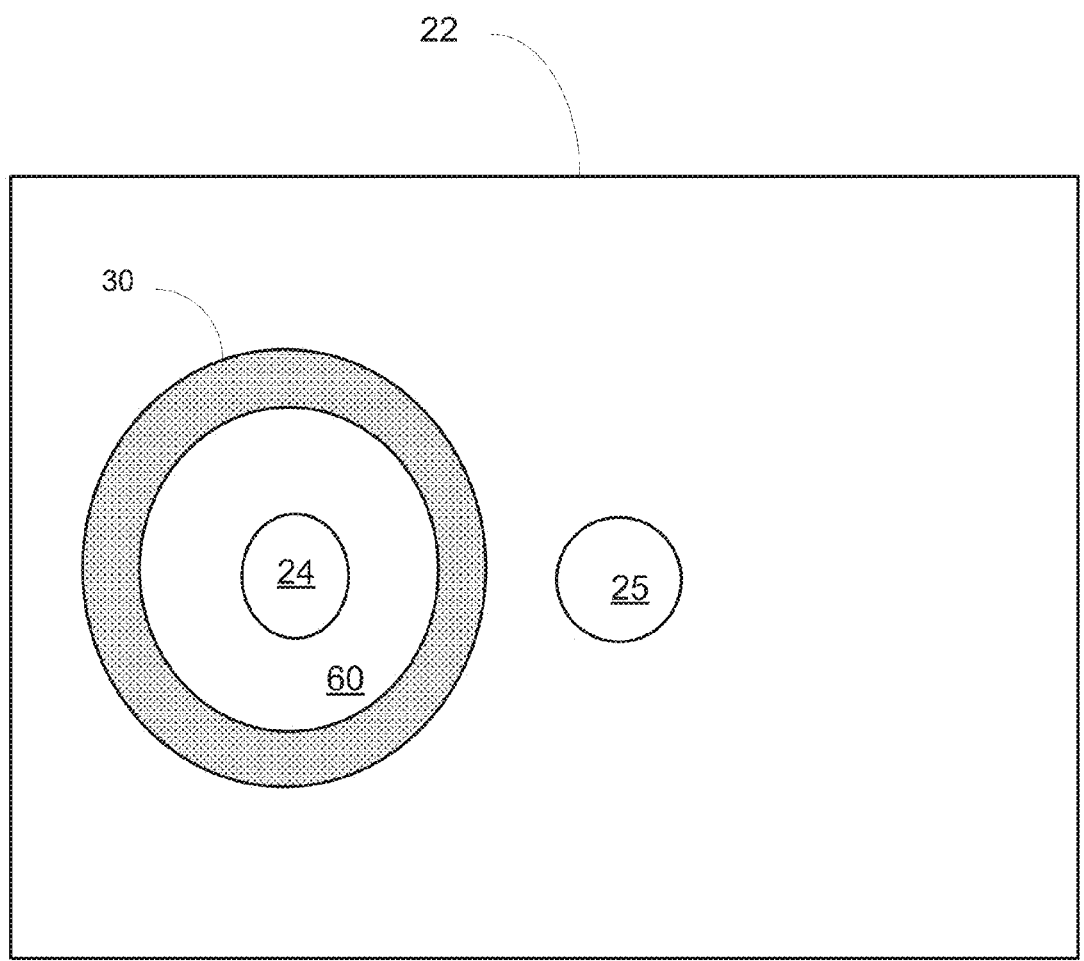
FIG. 13 is a top view of a lower plate, a gas flow module, a wafer and two lower plate apertures according to an embodiment of the invention.

There may be provided a system that can be implemented by the system and include directing gas flows towards a wafer by a gas flow unit that is positioned below the optical bench or at least has multiple apertures positioned below most of the optical bench. This is illustrated in FIGS. 12 and 13.

This system and method can be applied to all atmospheric tools but it is not limited to them since not atmospheric tools as scanning electron microscope (SEM) systems have a section before the vacuum chamber where the wafer is kept clean by means of clean gas flow.

According to an embodiment of the invention there is provided a system (referred to as "wafer shower" in which gas streams are generated in proximity to the wafer by a unit that is not above the optical bench—it may be located between the optical bench and the wafer, may have apertures that surround the bottom edge of the optical head (or lenses) of the optical bench and the like.

FIG. 11 illustrates method 200 according to an embodiment of the invention.

Method 200 may include stages 210 and 220 that may be executed in a partially overlapping or an overlapping manner.

Stage 210 may include directing nanometric electromagnetic radiation, by a second optical element, towards an object and through first and second openings.

Stage 220 may include directing, by a gas flow module, clean gas towards the object. The first opening is defined by a structural support element that is arranged to support a first optical element that is positioned above the structural support element. The gas flow module is positioned below the structural support element and is shaped to define the second opening. The object is positioned in a non-vacuumed environment.

According to an embodiment of the invention there is provided a system (referred to as "wafer gas pot") in which gas streams are generated in proximity to the wafer by a unit that is below the optical bench—and surrounds the wafer. It may have an annular shape.

In all configurations a traditional FFU unit can be provided (above the optical bench) to keep tool optics clean but this is not necessarily so.

The wafer can be supported by a stage that moves in both axes (x and Y). As every moving part, the stage movement generates and excites particles movement. Special attention should be paid in the particles generated at the gas bearings of the stages which tend to blow particles form the porous surface of the granite.

It is noted that gas turbulence on the wafer's surface can be prevented because it may cause optical aberrations. Generally the distance between the optics and the wafer is a few millimeters.

According to an embodiment of the invention there is provided a system that may include (a) optics arranged to direct electromagnetic radiation of nanometric wavelength towards an object; and (b) a gas flow module that is positioned below the optics, at least partially surrounds the object, and is arranged to direct clean gas towards at least one out of the object and a vicinity of the object. FIGS. 12 and 13 illustrate a gas flow module 30 that is positioned below optical evaluation modules 28 and 29 and even below object 60. The gas flow module 30 at least partially surrounds the object 60 and may have an upper surface (in which gas flow openings are formed) that may be below the object 60, below a top surface of the object 60, at the same level as the top surface of the object or above the object 60. The gas flow module can be entirely positioned not directly above the object 60. The gas flow module 30 can be connected to stage 66. It may contact stage 60 or be spaced apart from stage 66.

It is noted that additional and/or other parts of the gas flow module may include one or more gas flow openings and that the shape of the gas flow module can be annular or have another shape.

According to an embodiment of the invention a combination of the gas flow modules of any of the figures can be provided. For example, one gas flow module can be positioned below the optical components of the optics while another gas flow module can define an aperture that may allow an optical element of the optics to pass therethrough.

Yet according to an embodiment of the invention there may be provided a gas flow module that defines an aperture through which nanometric electromagnetic radiation directed towards the object can pass wherein the gas flow module does not surround the object and is positioned below any optical element. A ring shaped gas flow module that does not surround the object and is positioned between the object 60 and any optical components is illustrated in FIGS. 15 and 11D.

FIG. 14 illustrates method 300 according to an embodiment of the invention.

Method 300 may include stages 310 and 320 that may be executed in a partially overlapping or an overlapping manner.

Stage 310 includes directing nanometric electromagnetic radiation towards an object. The object is positioned in a non-vacuumed environment.

Stage 320 include directing towards at least one of the object and a vicinity of the object clean gas by a gas flow module that is positioned below the optics and at least partially surrounds the object. It usually surrounds the entire object.

Those skilled in the art will recognize that the boundaries between logic blocks are merely illustrative and that alternative embodiments may merge logic blocks or module elements or impose an alternate decomposition of functionality upon various logic blocks or module elements. Thus, it is to be understood that the architectures depicted herein are merely exemplary, and that in fact many other architectures can be implemented which achieve the same functionality.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

Also for example, the examples, or portions thereof, may implemented as soft or code representations of physical circuitry or of logical representations convertible into physical circuitry, such as in a hardware description language of any appropriate type.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

What is claimed is:

1. A system, comprising:
   a structural support element arranged to support at least a part of an optical bench comprising an optical evaluation module;
   a mechanical stage configured to support an object being evaluated by the optical evaluation module and configured to move the object along a predetermined path in relation to the optical evaluation module; and
   a gas flow module positioned below the optical bench in a fixed relationship with the structural support and positioned between the structural support and the mechanical stage, the gas flow module including an aperture through which the optical module can illuminate the object and a plurality of gas flow openings surrounding the aperture and defining a coverage area that is larger than the object, wherein the gas flow module is configured to direct clean gas in the coverage area towards the object while the object is illuminated by the optical module;
   wherein the mechanical stage is further configured to move the object along a predetermined path in relation to the aperture and wherein the coverage area is positioned directly above at least a majority of the object at all times regardless of where the object is positioned along the predetermined path.

2. The system according to claim 1 wherein the coverage area is positioned directly above at least seventy percent of the object when the object is positioned anywhere along the predetermined path.

3. The system according to claim 1 wherein the coverage area is positioned directly above at least eighty percent of the object when the object is positioned anywhere along the predetermined path.

4. The system according to claim 1 wherein the gas flow module comprises at least one gas inlet for receiving either gas or clean gas.

5. The system according to claim 1 further comprising:
   a gas inlet for receiving gas;
   a gas conduit that extends between the gas inlet and the gas flow module;
   a pump spaced apart from the gas flow module and configured to direct the gas from the gas inlet and through the conduit towards the gas flow module; and
   a filter positioned within the conduit or within the gas flow module and configured to filter the gas to provide a clean gas.

6. The system according to claim 5 wherein the gas inlet is positioned above an optical element of the optical module.

7. The system according to claim 5 wherein a distance between the pump and the gas flow module is smaller than a distance between the gas inlet and the pump.

8. The system according to claim 1 wherein the gas flow module is arranged to direct gas flows towards contaminating elements positioned at a vicinity of the object and thereby reject contaminants from reaching the object.

9. The system according to claim 1 wherein the mechanical stage is arranged to move the object at a fixed velocity in the range of 0.1-2 meters per second.

10. The system according to claim 1 wherein the gas flow module is arranged to direct the clean gas in a velocity in the range of 0.1-0.5 meters per second.

11. The system according to claim 1 wherein a distance between the optical module and the object is in the range of 10-50 millimeters.

12. The system according to claim 1 wherein:
   the structural support supports at least first and second optical modules;
   the gas module includes first and second apertures aligned with the first and second optical modules, respectively, with gas flow holes surrounding each of the first and second apertures; and the mechanical stage is configured to move the object along a predetermined path that results in the object passing under each of the first and second apertures.

13. The system according to claim 1 wherein the aperture has a diameter that is smaller than a diameter of the object being evaluated.

14. The system according to claim 13 wherein the plurality of gas flow openings completely surround the aperture.

15. The system according to claim 1 wherein the gas flow module includes a single main body that includes the plurality of gas flow openings.

16. The system according to claim 15 wherein the plurality of gas flow openings includes a first plurality of gas flow openings that are directly above the object being evaluated, and a second plurality of gas flow openings that are positioned around the object being evaluated; wherein the first and second plurality of gas flow openings lie in the same plane.

17. A system, comprising:
an optical bench comprising optics arranged to direct electromagnetic radiation of nanometric wavelength towards an object;
a structural support member that supports the optics;
a mechanical stage configured to support the object while electromagnetic radiation is directed towards the object by the optics; and configured to move the object along a predetermined path in relation to the optical evaluation module; and
a gas flow module positioned below the optical bench in a fixed relationship with the structural support member below the optics and below the object, the gas flow module including an aperture through which the electromagnetic radiation from the optics can irradiate the object and a plurality of gas flow openings surrounding the aperture to define a coverage area that is larger than the object, the gas flow module being arranged to direct clean gas through the plurality of gas flow openings towards at least one out of the object and a vicinity of the object.

18. The system according to claim 17 wherein:
the structural support supports optics for at least first and second optical modules;
the gas module includes first and second apertures aligned with the first and second optical modules, respectively, with gas flow holes surrounding each of the first and second apertures; and
the mechanical stage is configured to move the object along a predetermined path that results in the object passing under each of the first and second apertures.

19. A method for directing clean gas towards an object, the method comprising:
moving an object by a mechanical stage and along a predetermined path in relation to an optical module included within an optical bench during an illumination of the object by the optical module; and
while supporting the at least a part of the optical module by a structural support element, directing by a gas flow module, attached in a fixed relationship to the structural support below the optical bench, clean gas towards the object through one or more gas flow module openings that define a coverage area larger than the object and positioned directly above at least a majority of the object when the object is positioned anywhere along the predetermined path.

20. The Method according to claim 19 wherein the coverage area is positioned directly above at least seventy percent of the object when the object is positioned anywhere along the predetermined path.

21. The Method according to claim 19 wherein the coverage area is positioned directly above at least eighty percent of the object when the object is positioned anywhere along the predetermined path.

22. The method according to claim 19 wherein the moving an object by a mechanical stage comprises moving the mechanical stage at a fixed velocity in the range of 0.1-2 meters per second.

23. The method according to claim 19 wherein said directing comprises directing by a gas flow module direct clean gas in a velocity in the range of 0.1-0.5meters per second, towards the object through one or more gas flow module openings that define a coverage area.

24. The method according to claim 19 wherein said moving includes moving the wafer in a predetermined path in relation to an optical module at a distance from the optical module which is in the range of 10-50 millimeters.

* * * * *